(12) United States Patent
Lee et al.

(10) Patent No.: US 7,920,432 B2
(45) Date of Patent: Apr. 5, 2011

(54) SEMICONDUCTOR DEVICE HAVING RESISTANCE BASED MEMORY ARRAY, METHOD OF READING, AND SYSTEMS ASSOCIATED THEREWITH

(75) Inventors: Kwang Jin Lee, Hwaseong-si (KR); Du Eung Kim, Yongin-si (KR); Yong Jun Lee, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 239 days.

(21) Appl. No.: 12/292,897

(22) Filed: Nov. 28, 2008

(65) Prior Publication Data

US 2009/0257292 A1 Oct. 15, 2009

(30) Foreign Application Priority Data

Apr. 15, 2008 (KR) .................. 10-2008-0034751

(51) Int. Cl.
*G11C 7/00* (2006.01)

(52) U.S. Cl. .................. 365/189.15; 365/189.011

(58) Field of Classification Search ............. 365/189.15, 365/189.011
See application file for complete search history.

(56) References Cited

U.S. PATENT DOCUMENTS

| 5,793,681 | A  | * | 8/1998  | Nii ........................ 365/189.05 |
| 6,351,406 | B1 |   | 2/2002  | Johnson et al. |
| 6,545,906 | B1 |   | 4/2003  | Savtchenko et al. |
| 6,849,891 | B1 |   | 2/2005  | Hsu et al. |
| 7,038,961 | B2 |   | 5/2006  | Sakata et al. |
| 7,282,759 | B2 |   | 10/2007 | Kim et al. |
| 2007/0195582 | A1 | | 8/2007  | Sakata et al. |

OTHER PUBLICATIONS

K. Pagiamtzis et al., "Content-Addressable Memory (CAM) Circuits and Architectures: A Tutorial and Survey 'Content- addressable memory", Wikipedia article, Apr. 26, 2008.

* cited by examiner

*Primary Examiner* — Son Dinh
*Assistant Examiner* — Nam T. Nguyen
(74) *Attorney, Agent, or Firm* — Harness, Dickey & Pierce

(57) ABSTRACT

One embodiment includes a non-volatile memory cell array, and a read unit configured to disable read operation for the non-volatile memory cell array for a time period following writing of data in the non-volatile memory cell array.

11 Claims, 21 Drawing Sheets

FIG. 2

| 10_1 | 10_2 | 10_3 | 10_4 | 10_5 | 10_6 | 10_7 | 10_8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |

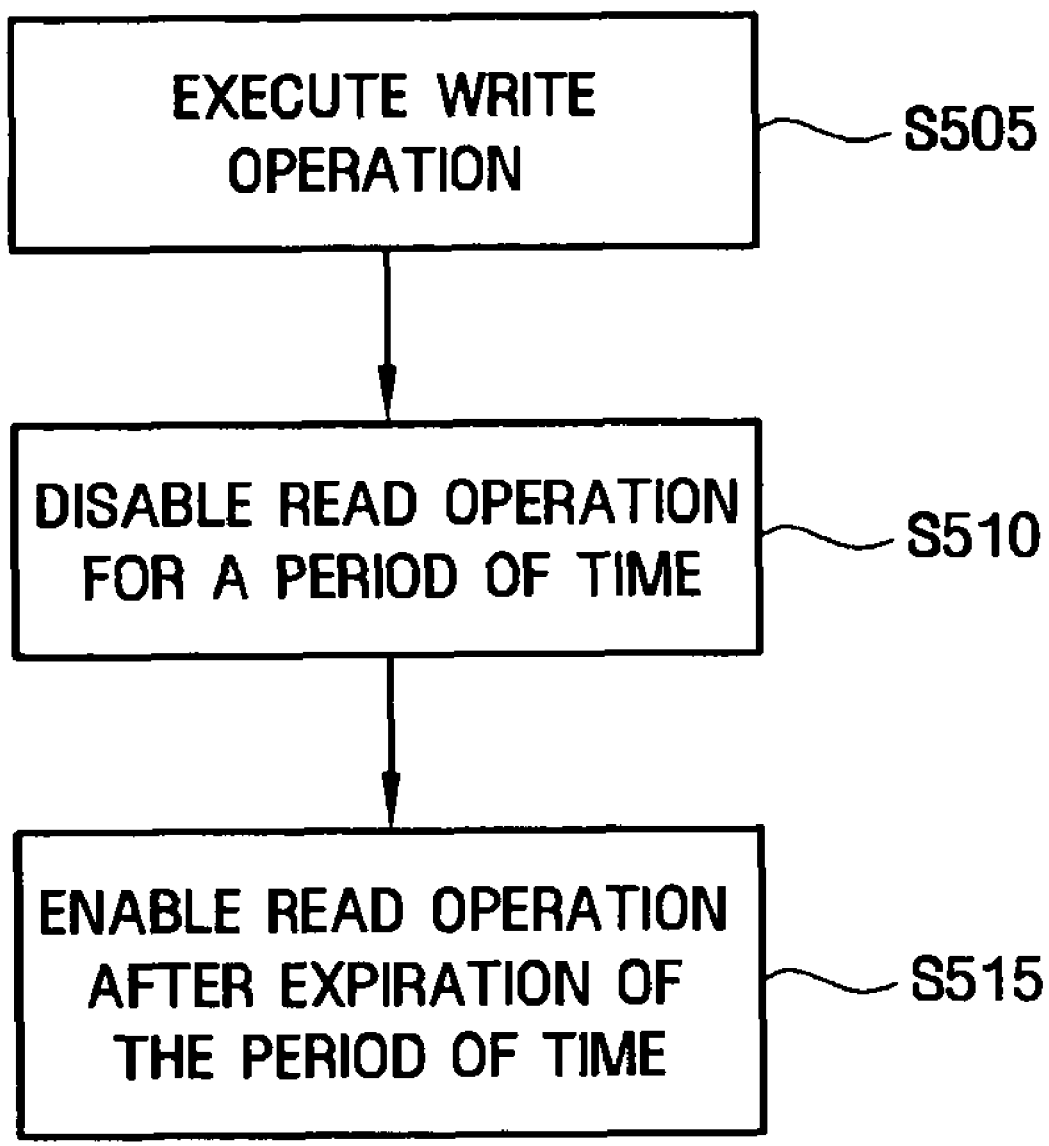

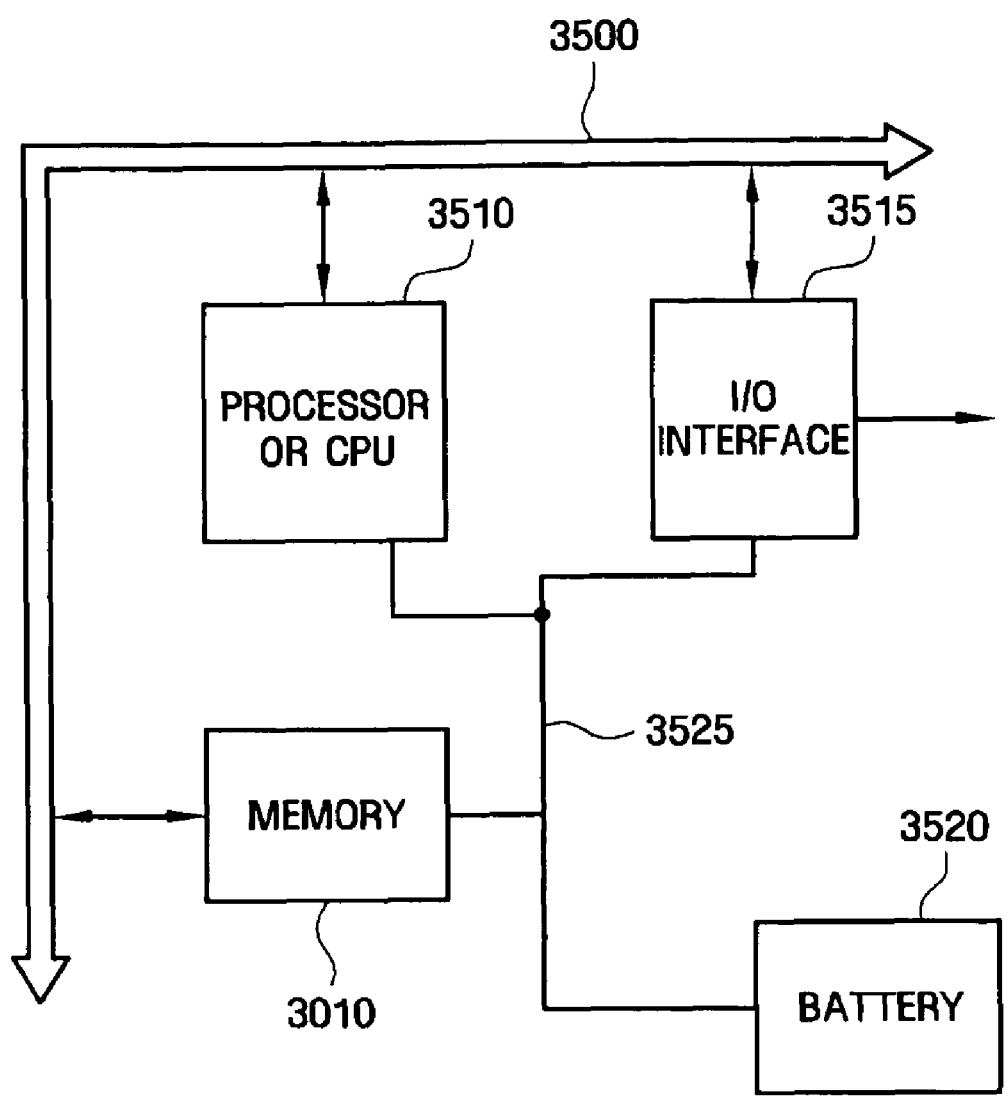

US 7,920,432 B2

SEMICONDUCTOR DEVICE HAVING RESISTANCE BASED MEMORY ARRAY, METHOD OF READING, AND SYSTEMS ASSOCIATED THEREWITH

PRIORITY INFORMATION

The subject application claims priority under 35 U.S.C. 119 on Korean application nos. 10-2008-0034751 filed Apr. 15, 2008; the contents of which are hereby incorporated by reference in their entirety.

CROSS REFERENCE TO RELATED APPLICATIONS

The subject application is related to co-pending application Ser. Nos. 12/292,890, 12/292,891, and 12/292,896 ; all of which are hereby incorporated by reference in their entirety.

BACKGROUND

Embodiments relate to semiconductor devices having a resistance based memory array. For example, a resistance based memory array may be a PRAM (phase change material RAM), RRAM or ReRAM (resistive RAM), MRAM (magnetic RAM), etc.

SUMMARY OF THE INVENTION

The present invention relates to a semiconductor device.

One embodiment includes a non-volatile memory cell array, and a read unit configured to disable read operation for the non-volatile memory cell array for a time period following writing of data in the non-volatile memory cell array.

For example, the read unit may be configured to disable reading of data from the non-volatile memory cell array for the time period following writing of data in the non-volatile memory cell array. As another example, the read unit may be configured to disable outputting read data from the non-volatile memory cell array for the time period following writing of data in the non-volatile memory cell array.

Another embodiment includes a non-volatile memory cell array, an address buffer configured to store write addresses for write operations, and a read unit configured to selectively disable read operation for the non-volatile memory cell array for a time period based on whether an input read address matches at least one of the stored write addresses.

A further embodiment includes a non-volatile memory cell array, an address buffer configured to store an address associated with data being written into the non-volatile memory cell array, and a recovery timer configured to measure a first time period since a last write operation. A read unit is configured to selectively disable read operation for the non-volatile memory cell array based on whether the first time period has expired.

A still further embodiment includes a non-volatile memory cell array, an address buffer configured to store write addresses for write operations, and a recovery timer configured to measure a first time period since a last write operation. A read unit is configured to disable a read operation for the non-volatile memory cell array based on one of (1) following writing of data in the non-volatile memory cell array, (2) whether an input read address matches at least one of the stored write addresses, and (3) whether the first time period has expired.

The present invention also relates to a method of operating a semiconductor device.

In one embodiment, the method includes disabling read operation for a non-volatile memory cell array for a time period following writing of data in the non-volatile memory cell array.

In another embodiment, the method includes storing write addresses for write operations to a non-volatile memory cell array, and selectively disabling read operation for the non-volatile memory cell array for a time period based on whether an input read address matches at least one of the stored write addresses.

In further embodiment, the method includes storing an address associated with data being written into a non-volatile memory cell array, measuring a first time period since a last write operation, and selectively disabling read operation for the non-volatile memory cell array based on whether the first time period has expired.

A still further embodiment includes selecting a mode of operation, and selectively disabling read operation for the non-volatile memory cell array based on a condition associated with the selected mode of operation.

The present invention also relates to implementations of the semiconductor device.

For example, one example implementation is a card. In one embodiment, the card includes a memory and a control unit configured to control the memory. The memory includes a non-volatile memory cell array, an address buffer configured to store write addresses for write operations, and a read unit configured to selectively disable read operation for the non-volatile memory cell array for a time period based on whether an input read address matches at least one of the stored write addresses.

Another example implementation is a system. In one embodiment, the system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array, an address buffer configured to store write addresses for write operations, and a read unit configured to selectively disable read operation for the non-volatile memory cell array for a time period based on whether an input read address matches at least one of the stored write addresses.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIG. 2 illustrates a layout of the cell array in FIG. 1 according to one embodiment.

FIG. 5 a flow chart of an operational concept according to one embodiment.

FIGS. 20-25 illustrate example embodiments of applications of the semiconductor device.

DETAILED DESCRIPTION OF EMBODIMENTS

Figure 1:
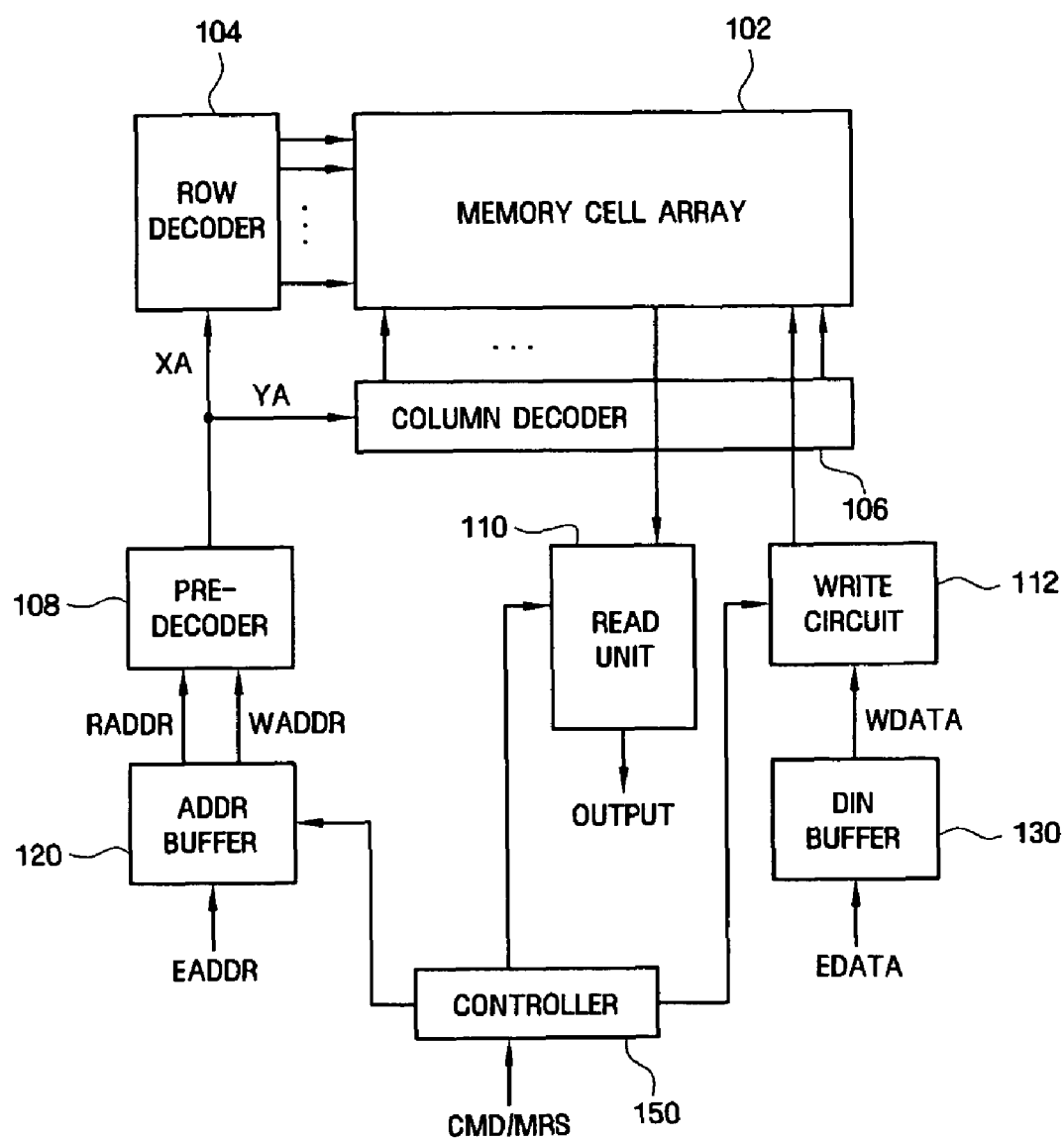
FIG. 1 illustrates a semiconductor device according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc. MRAMs use spin torque transfer phenomenon (STT). Spin torque transfer writing technology is a technology in which data is written by aligning the spin direction of the electrons flowing through a TMR (tunneling magneto-resistance) element. Data writing is performed by using a spin-polarized current with the electrons having the same spin direction. U.S. Pat. No. 6,545,906 discloses an example MRAM, and is incorporated herein by reference in its entirety.

RRAM or ReRAM takes advantage of controllable resistance changes in thin films of various resistance materials. For example, a dielectric, which is normally insulating, can be made to conduct through a filament or conduction path formed after application of a sufficiently high voltage. The conduction path formation can arise from different mechanisms, including defects, metal migration, etc. Once the filament is formed, the filament may be reset (broken, resulting in high resistance) or set (re-formed, resulting in lower resistance) by an appropriately applied voltage. During application of the appropriate voltage, resistance varies until the high resistance or low resistance state is achieved. U.S. Pat. Nos. 6,849,891 and 7,282,759 disclose example RRAMs, and are both incorporated herein by reference in their entirety.

PRAMs rely on the application of heat to phase change resistor cells to change the resistive state of the phase change resistor cells. Normally, a current is supplied to the phase change resistor cell to apply the heat. The amount and duration of the current establishes whether the phase change resistor cell achieves a low resistance state or achieves a high resistance state. The low resistive state is called a set state and may represent, for example, a logic zero state. The high resistive state is called a reset state, and may represent, for example, a logic high state. GST or a chalcogenide alloy is a common phase change material used in the phase change resistor cells.

After application of heat to effect a state change, an amount of time must pass before the phase change material stabilizes in the set or reset states. Accordingly reading from a cell prior to the cell settling in the set or reset state may result in incorrect reading of data from the memory cell array.

First Embodiment

Figure 3:
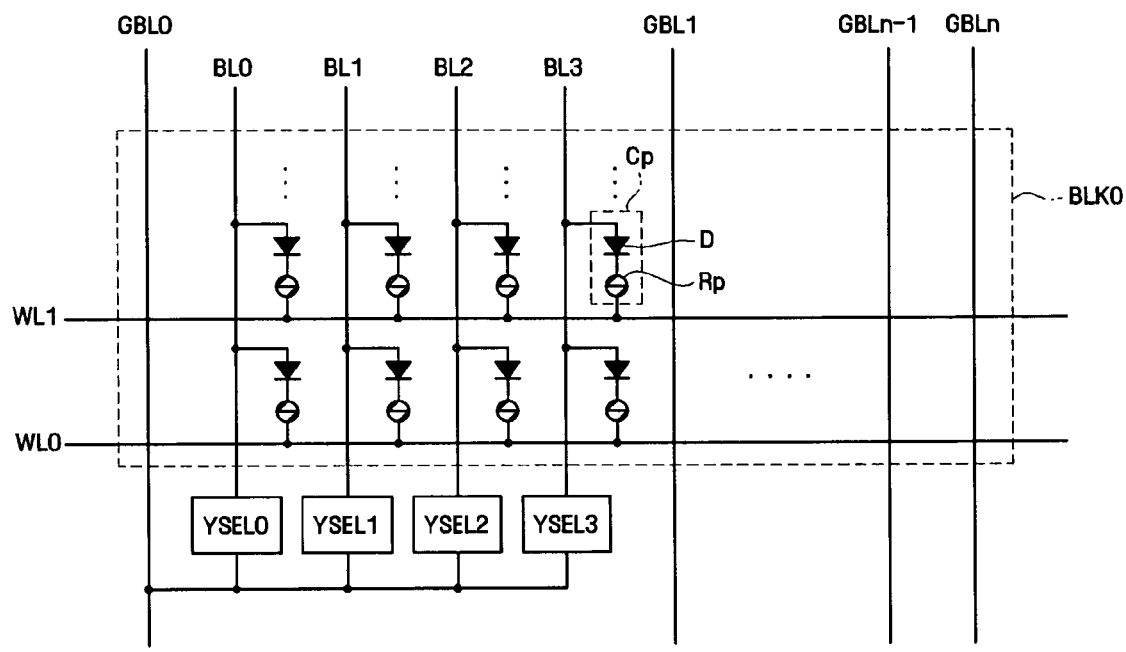
FIG. 3 illustrates a portion of memory block BLK0 in FIG. 2.

FIG. 1 illustrates a semiconductor device according to an embodiment. As shown, the semiconductor device includes a non-volatile memory cell array 102. In one embodiment, the non-volatile memory cell array 102 is a resistive material based memory cell array. For the purposes of example only, the memory cell array 102 will be described as being a phase change memory cell array (PRAM); however, it will be understood that the memory cell array 102 may be any resistive material based memory array such as PRAM, RRAM, MRAM, etc. FIG. 2 illustrates a layout of the cell array 102 according to one embodiment. As shown, the memory cells in the array are divided into memory banks 10, and each memory bank 10 is divided into memory blocks BLKi. FIG. 3 illustrates a portion of memory block BLK0. It will be appreciated that the other memory blocks may be structured in the same manner. As shown, PRAM cells Cp are located at the intersections of word lines Wi (e.g., W1 and W2) and bit lines BLi (e.g., BL0, BL1, BL2, and BL3). Each PRAM cell Cp includes a current control device D and a phase change resistor cell Rp connected in series between a respective bit line BLi and a word line Wi. As shown, each current control device D is a diode, but may instead be a transistor. Furthermore, each phase change resistor cell Rp may be formed of phase change material disposed between two electrodes. The phase change material may be GeSbTe (GST), GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb(SeTe), $Te_{81}Ge_{15}Sb_2S_2$, etc.

A column selector YSELi selectively connects each respective bit line BLi to a global bit line GBL0. This structure is repeated for several global bit lines GBLi. Furthermore, while only two word lines are shown, it will be appreciated that a single block BLKi may include more than two word lines, with the commensurate increase in PRAM cells Cp. Similarly, instead of four bit lines BLi being associated with each global bit line GBLi, more or less than four bit lines BLi may be associated with each global bit line GBLi.

Returning to FIG. 1, an external address EADDR is received and buffered by an address buffer 120 in association with a command CMD received by a controller 150. The controller 150 decodes the command CMD into a write command, read command, etc. The controller 150 sends the read or write command to the address buffer 120. For write commands, the address buffer 120 stores and outputs the external address EADDR as a write address WADDR. For read commands, the address buffer 120 stores and outputs the external address EADDR as a read address RADDR.

A pre-decoder 108 pre-decodes the received read or write address into row and column addresses. A row decoder 104 further decodes the row address and selectively drives the word lines WLi in the memory cell array 102. A column decoder 106 further decodes the column address and selectively controls the column selectors YSELi to connect bit lines BLi to global bit lines GBLi.

During a write operation, externally supplied data EDATA is buffered by a data input buffer 130, and supplied as write WDATA to a write circuit 112. The write circuit 112, as instructed by the controller 150, writes the write data WDATA in the memory cell array 102 by supplying the appropriate currents and/or voltages to set or reset the memory cells consistent with the logic states of the write data WDATA. As discussed above, the memory cells being written are selected by the row and column decoders 104 and 106.

Figure 4A:
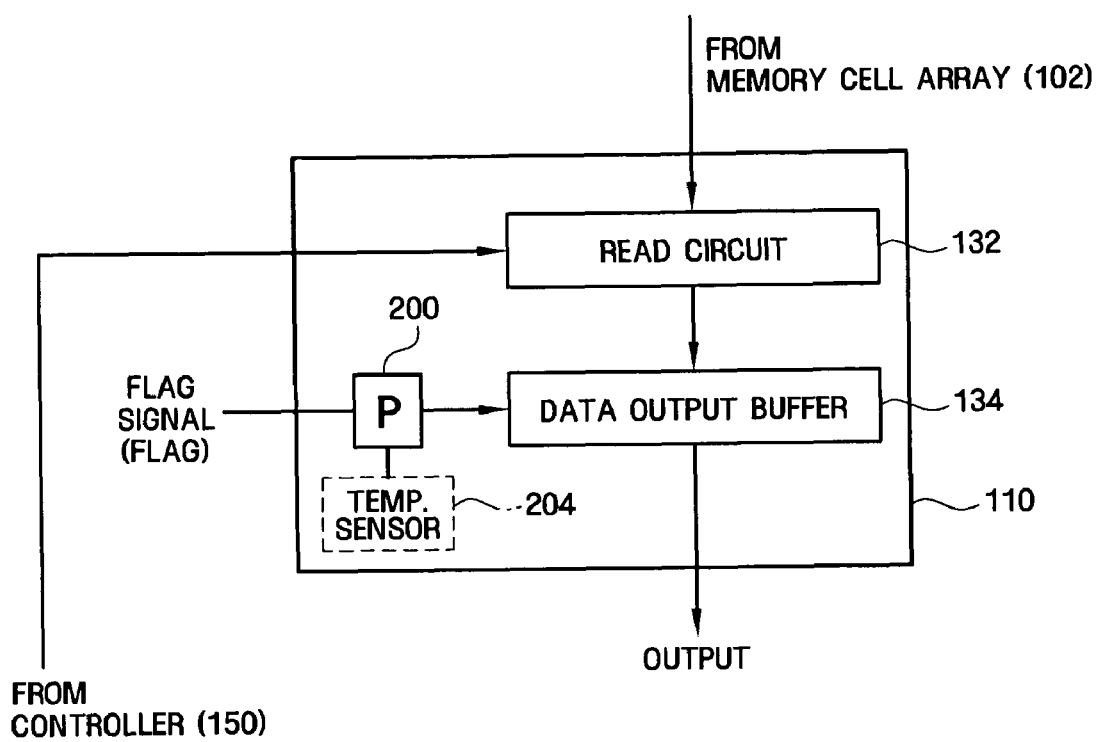
FIG. 4A illustrates an example embodiment of the read unit in FIG. 1.

During a read operation, a read unit 110 shown in FIG. 1 applies appropriate currents and/or voltages to the addressed memory cell or cells as instructed by the controller 150 and outputs the read data. FIG. 4A illustrates one embodiment of the read unit 110. As shown, the read unit 110 includes a read circuit 132 and a data output buffer 134. The read circuit 132 reads the data from the addressed memory cell or cells, and outputs the read data to the data output buffer 134. The data output buffer 134 receives the data read by the read circuit 132, buffers the read data, and outputs the buffered data. A pause unit 200 receives a flag signal FLAG, and selectively disables outputting by the data output buffer 134 for a period of time. In the embodiment of FIG. 1, the flag signal FLAG is supplied by the controller 150. For example, if the pause unit 200 receives a logic "1" (e.g., logic high) pulse the pause unit 200 is triggered or enabled to pause the outputting of data from the data output buffer 134. Stated another way, while the flag signal FLAG is logic "0" (e.g., a logic low), the pause unit 200 does not disable the data output buffer 134 from outputting data. But, if triggered by a logic "1" flag signal FLAG, the pause unit 200 disables the data output buffer 134 from outputting for a period of time.

The period of time may be fixed. For example, the period of time may be programmable by applying a command or mode register set such that, in response, the controller 150 programs a received desired time in the pause unit 200. The time period may also be set in other ways such as through fuses, etc. As yet a further alternative, the time period may be adjustable based on operating conditions such as temperature. This may be accomplished by using temperature dependent components in the pause unit 200. Optionally, the pause unit 200 may adjust the period of time based on operating conditions indicated by one or more sensors. For example, FIG. 4A shows an optional temperature sensor 204, which provides the pause unit 200 with the operating temperature. In this optional embodiment, the pause unit 200 adjusts the time period based on the indicated temperature. It will be appreciated that the present invention is not limited to temperature as the operating condition.

Figure 4B:
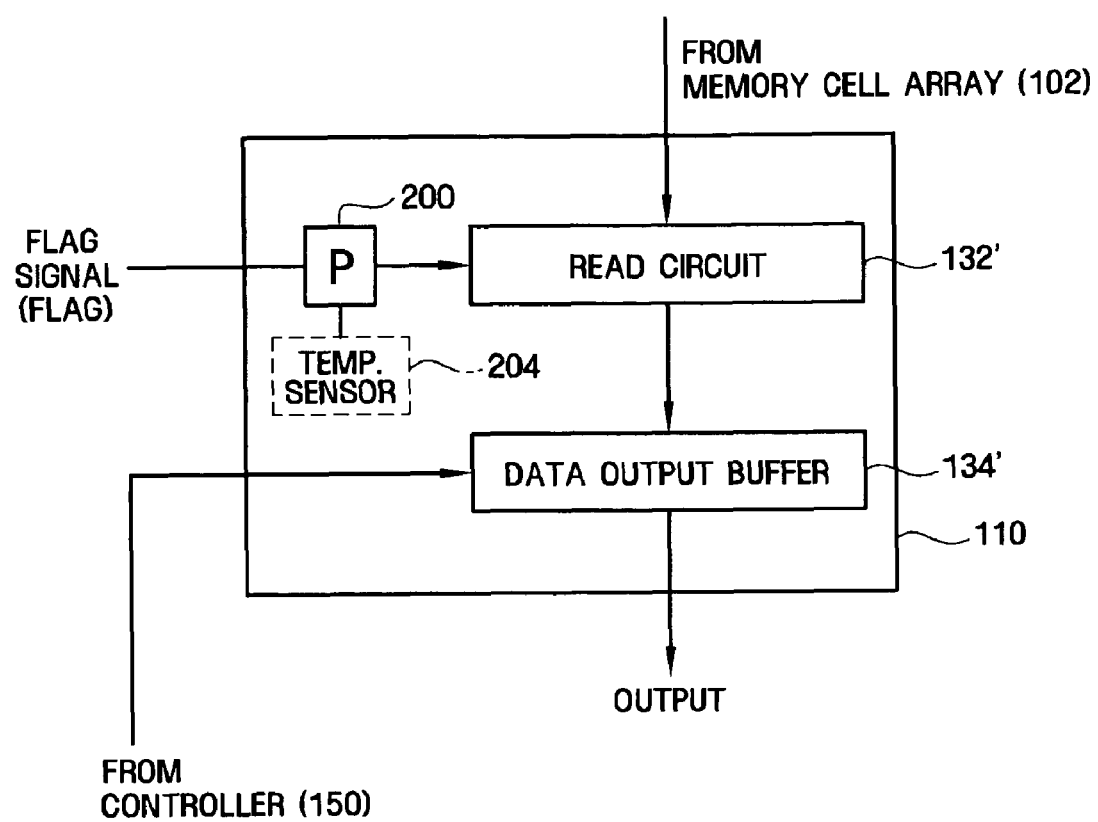
FIG. 4B illustrates another example embodiment of the read unit in FIG. 1.

FIG. 4B illustrates another embodiment of the read unit 110 in FIG. 1. In this embodiment, the read unit 110 includes a read unit 132' and a data output buffer 134'. The read circuit 132' reads the data from the addressed memory cell or cells, and outputs the read data to the data output buffer 134'. The data output buffer 134' receives the data read by the read circuit 132', buffers the read data, and outputs the buffered data. The pause unit 200 receives a flag signal FLAG, and selectively disables reading by the read unit 132' for a period of time. In the embodiment of FIG. 1, the flag signal FLAG is supplied by the controller 150. The pause unit 200 may disable amplifiers (e.g., sense amplifiers) in the read circuit 132'. Similar to the embodiment of FIG. 4A, if the pause unit 200 receives a logic "1" (e.g., logic high) pulse, the pause unit 200 is triggered or enabled to pause the reading of data by the read circuit 132'. Stated another way, while the flag signal FLAG is logic "0" (e.g., a logic low), the pause unit 200 does not disable the read circuit 132' from reading data. But, if triggered by a logic "1" flag signal FLAG, the pause unit 200 disables the read circuit 132' from reading data for a period of time. The period of time may be the same as discussed above with respect to the embodiment of FIG. 4A.

FIG. 5 illustrates operation of the semiconductor device of FIG. 1 according to one embodiment. As shown, in step S505 a write operation is executed and completed as described above, in response to receipt of a write command and associated write data. Upon completion of the write operation, the controller 150 generates a flag signal FLAG that triggers the pause unit 200 to disable read operation for the non-volatile memory cell array 102 in step S510. For example, the controller 150 generates a flag signal FLAG having a logic "1" pulse (e.g., a logic high signal) to trigger the pause unit 200 to disable the read unit 110.

In the embodiment of FIG. 4A, the pause unit 200 disables the data output buffer 134 from outputting data in step S510. In this embodiment, during the period of time that the pause unit 200 pauses outputting of data from the data output buffer 134, data may still be read from the memory cell array 102 and stored in the data output buffer 134. In the embodiment of FIG. 4B, the pause unit disables the read circuit 132' from reading data.

Upon expiration of the period of time, the pause unit 200 enables read operation for the non-volatile memory cell array 102 in step S515.

Accordingly, this embodiment provides for data written into the memory cell array 102 to stabilize prior to being read. Namely, following the writing of data, the read operation is paused to permit the written data to stabilize. In this and the other embodiments, several data words may be written simultaneously such that the pause time per data word before a read operation may be performed is reduced.

Still further, in this and the other embodiments, the semiconductor device may be configured to disable the read operation on a cell block basis. Namely, disabling the read operation for one cell block does not affect operations associated with another cell block. Accordingly, while the read operation is disabled for one cell block, reading or writing may take place with respect to a different cell block.

Second Embodiment

Figure 6:
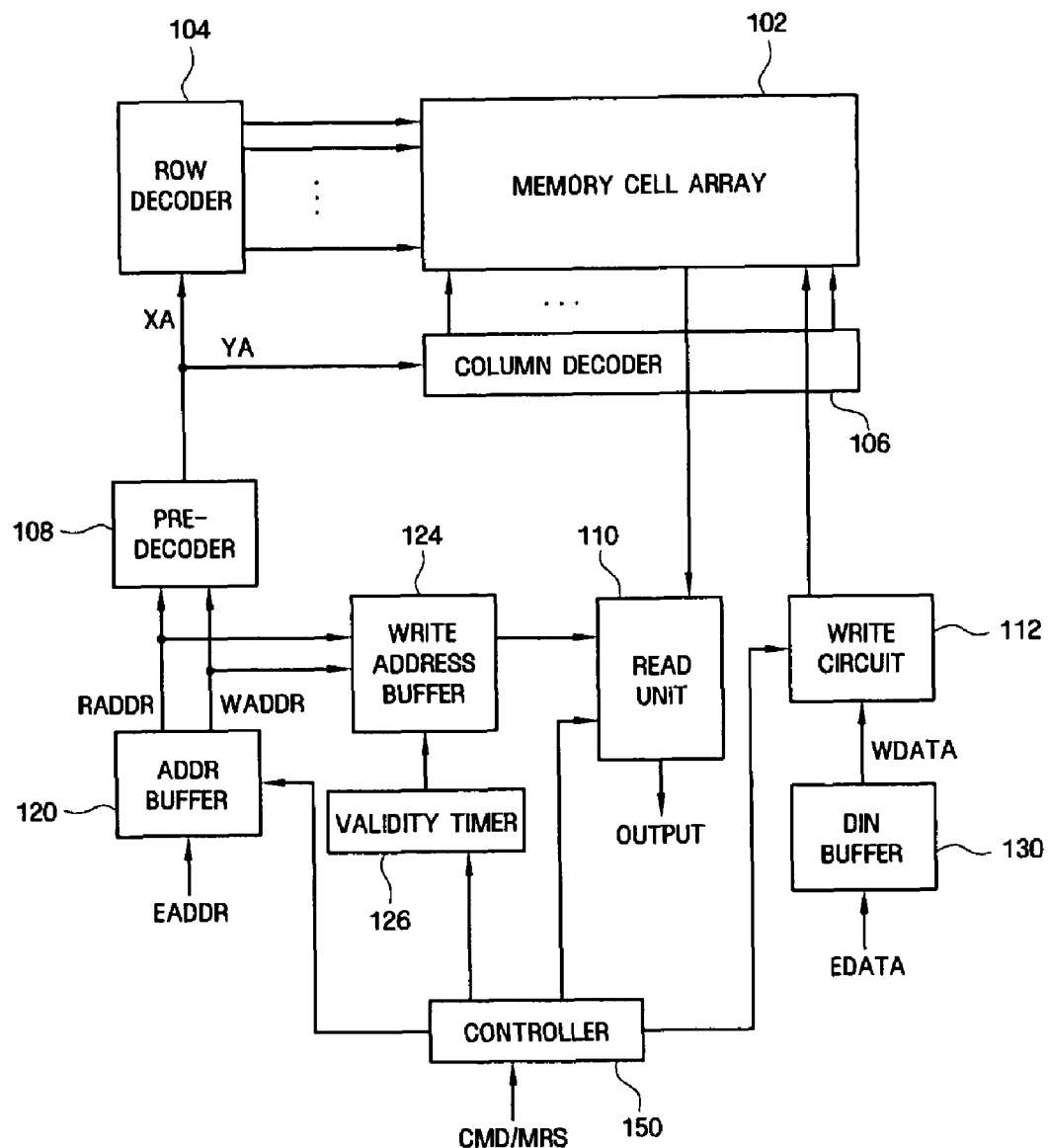
FIG. 6 illustrates a semiconductor device according to another embodiment.

FIG. 6 illustrates a semiconductor device according to another embodiment. As shown, the embodiment of FIG. 6 is the same as the embodiment of FIG. 1 except that the embodiment of FIG. 6 includes a write address buffer 124 and, optionally, a validity timer 126. Accordingly, only the differences between the embodiment of FIG. 6 and the embodiment of FIG. 1 will be described for the sake of brevity.

Figure 7:
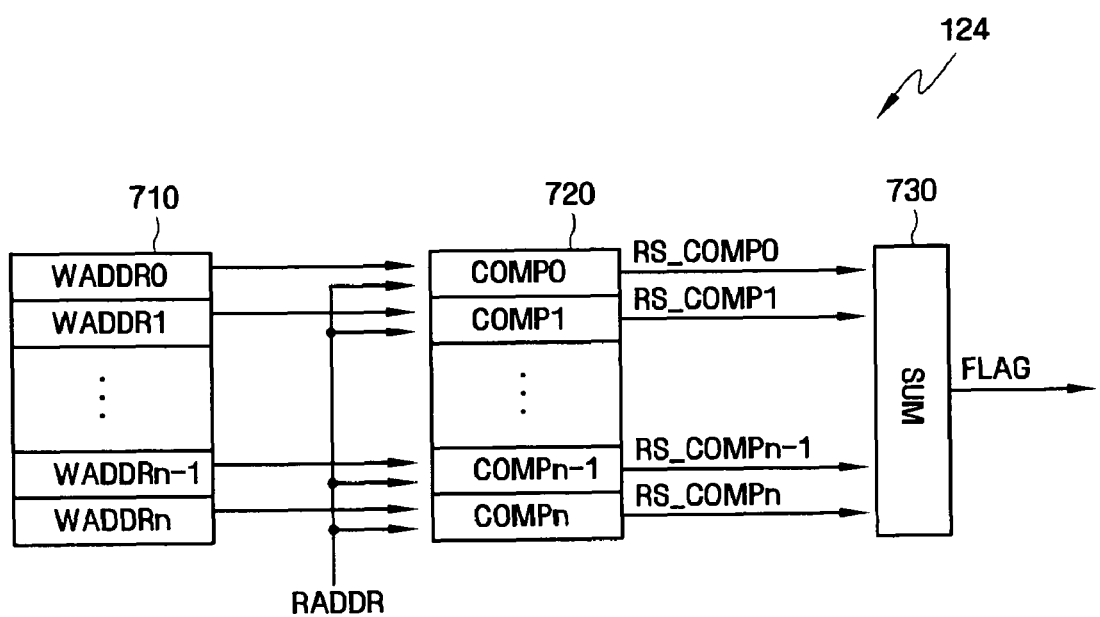
FIG. 7 illustrates one embodiment of the write address buffer in FIG. 6.

The write address buffer 124 stores the write addresses WADDRs output from the address buffer 120. FIG. 7 illustrates an example of the write address buffer 124. As shown, each write address WADDR is stored in an entry 710 of the write address buffer 124. The write address buffer 124 includes a comparator 720 associated with each entry 710. Each comparator 720 compares the write address WADDR stored in the corresponding entry 710 with an input read address RADDR, and generates a comparison signal or result RS_COMPi, for i=0 to n. In one embodiment, the comparison signal RS_COMP is a logic "1" if the read and write addresses match, and is a logic "0" if the read and write addresses do not match. A summer 730 performs a logical OR operation on the output from the comparators 720 to generate the flag signal FLAG. Namely, if the read address RADDR matches at least one write address WADDR, then the flag signal FLAG will be a logic "1"; otherwise, the flag signal FLAG will be a logic "0".

Figure 8:
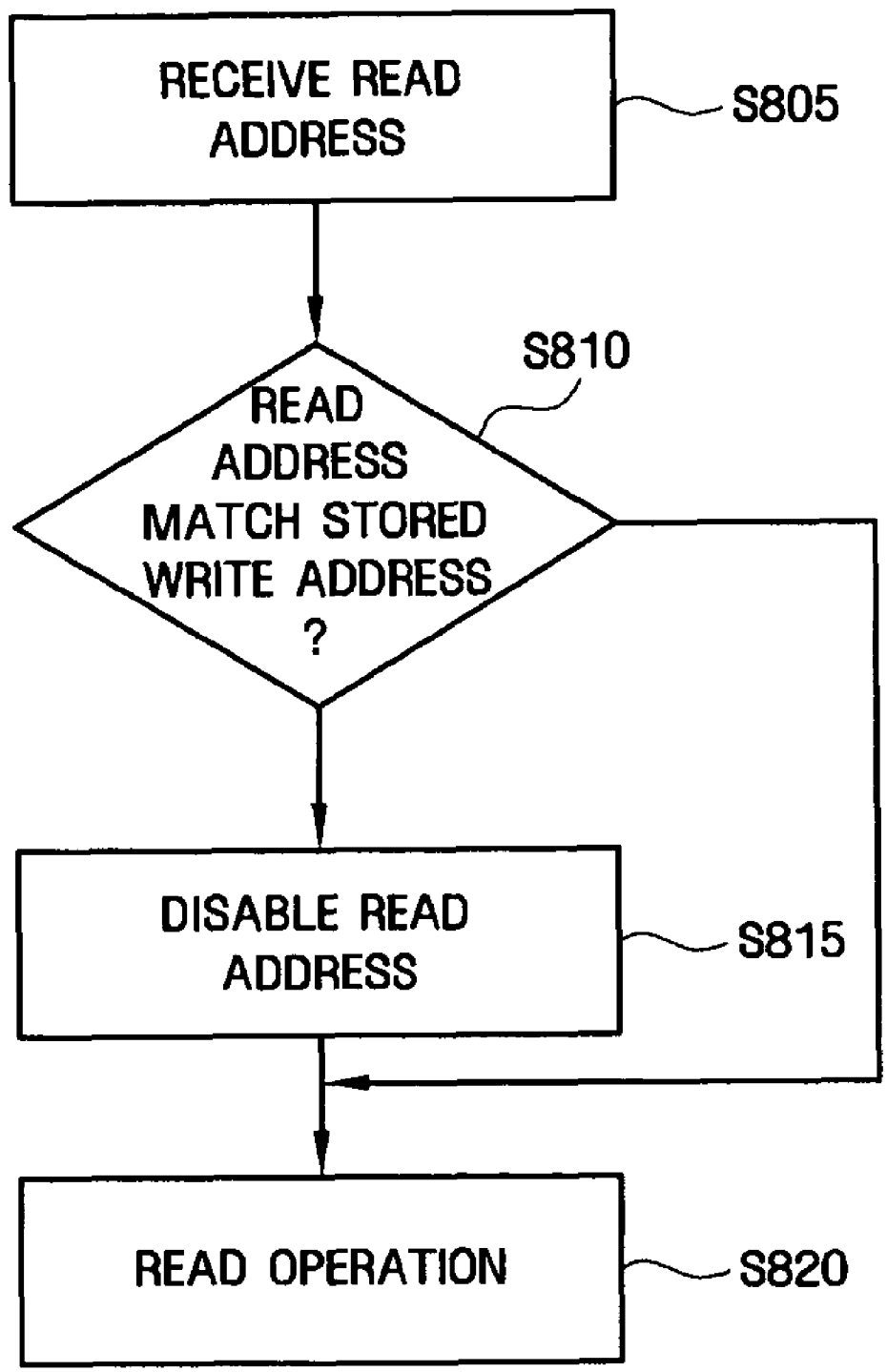
FIG. 8 illustrates a flow chart of an operational concept according to another embodiment.

As will be appreciated, in this embodiment, the pause unit 200 is triggered to disable the read unit 110 based on a flag signal FLAG from the write address buffer 124, not the controller 150. Here, if a read address for a current read operation matches a write address stored in the write address buffer 124 the pause unit 200 is triggered to disable the read unit 110. Namely, the data output buffer unit 134 (FIG. 4A) or the read circuit 132' (FIG. 4B) will be disabled for a period of time following a determination that a read address for a current read operation matches a write address stored in the write address buffer 124. FIG. 8 illustrates operation of the semiconductor device of FIG. 6 according to one embodiment. As shown, a read address is received in step S805 as part of a read operation. Then in step S810 the write address buffer 124 determines if the read address matches a write address stored in the write address buffer 124. If a match exists, read operation is paused or disabled for the period of time in step S815. The period of time may be fixed or adjustable as discussed above. After the period of time, read operation is enabled in step S820. Also, if no match exists in step S810, then read operation remains enabled in step S820.

As discussed above, the embodiment of FIG. 6 may also include a validity timer 126. The validity timer 126 measures a set period of time referred to as the validity time period. Measuring or counting down this time period restarts (or resets) with each receipt of a write command from the controller 150. Accordingly, consecutively received write commands cause successive resetting of the validity time period such that the validity time period expires after the set period of time from the last received write command. The validity timer 126 informs the write address buffer 124 of the validity time period or at least expiration of the validity time period via a validity timing signal VT. In response to expiration of the validity time period, the write address buffer 124 clears the entries 710. Namely, the write address buffer 124 erases the write addresses stored therein. In one embodiment, the validity time period is set equal to or longer than a period of time for data written into the memory cell array 102 to settle or stabilize. For example, the validity time period may be set longer than the expected settling time by a desired margin to account for manufacturing variations. The validity time period may be programmable by applying a command or mode register set such that, in response, the controller 150 programs a received desired validity time in the validity timer 126. The validity time period may also be set in other ways such as through fuses, etc. By including the validity timer 126, old write operations do not cause pausing of the read operation.

Third Embodiment

Figure 9:
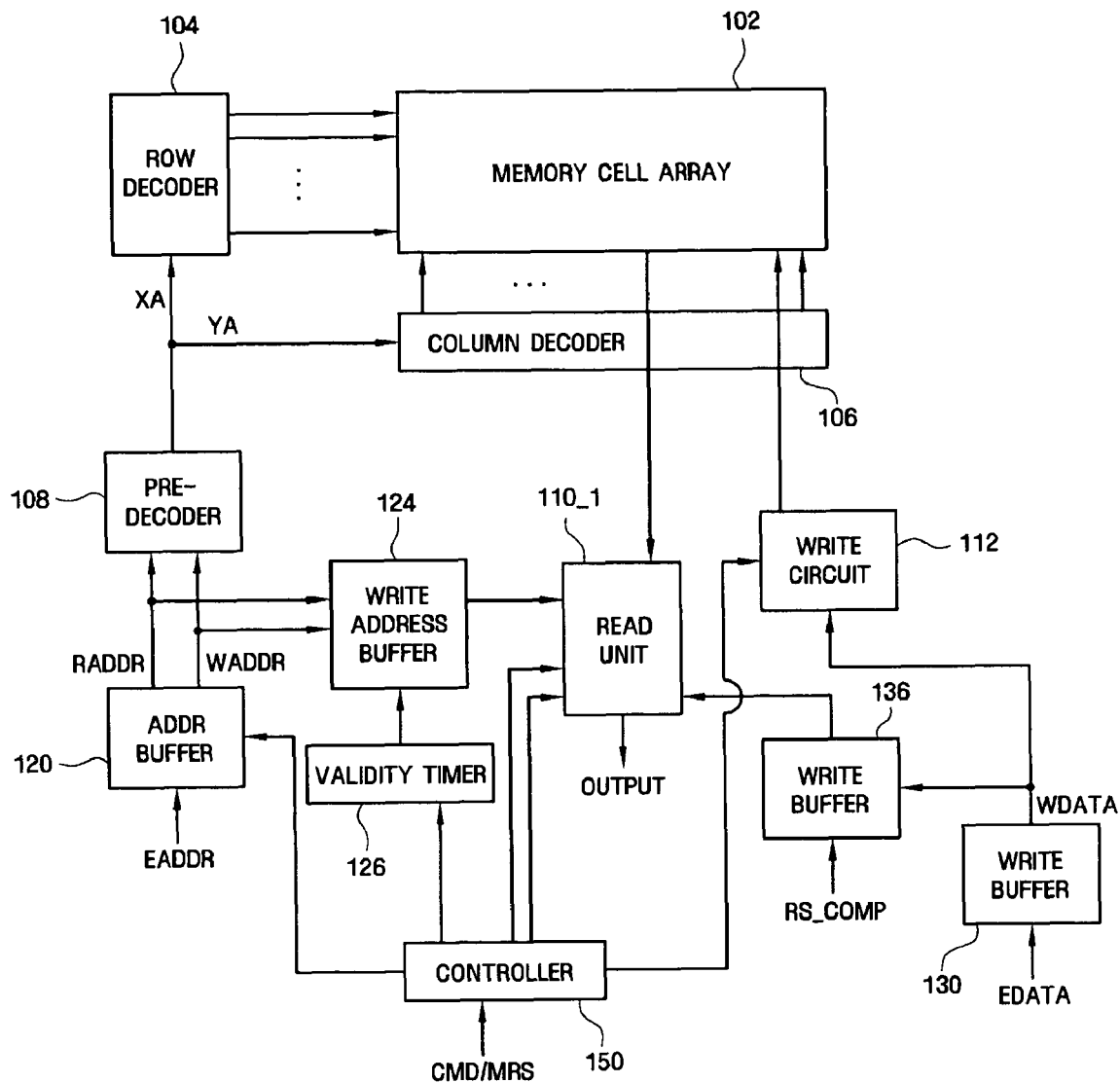
FIG. 9 illustrates a semiconductor device according to a further embodiment.

FIG. 9 illustrates a semiconductor device according to another embodiment. As shown, the embodiment of FIG. 9 is the same as the embodiment of FIG. 6 except that the read unit 110 of FIG. 1 has been replaced by a read unit 110-1 and the embodiment of FIG. 9 includes a write buffer 136. Accordingly, only the differences between the embodiment of FIG. 9 and the embodiment of FIG. 6 will be described for the sake of brevity.

As shown, the write buffer 136 receives and stores the write data WDATA output from the data input buffer 130. The write buffer 136 has a same size as the write address buffer 124, with the entries in the write buffer 136 matching the entries 710 in the write address buffer 124. More particularly, write data WDATA associated with a write address in the write address buffer 124 is stored in a corresponding entry in the write buffer 136. The write address buffer 136 also receives the comparison signals RS_COMP0 to RS_COMPn generated by the write address buffer 124. As discussed above with respect to FIG. 7, the comparators 720 in the write address buffer 124 generate respective comparison signals RS_COMP0 to RS_COMPn for the n+1 entries 710 of the write address buffer 124. Namely, each comparison signal RS_COMP corresponds to one of the entries 710 in the write address buffer 124, and therefore, also corresponds to one of the entries in the write buffer 136. Each comparison signal RS_COMP indicates whether the stored write address in the corresponding entry 710 matches a received read address. If a comparison signal RS_COMP indicates a match (e.g., is logic "1"), the write buffer 136 outputs the write data WDATA from the entry corresponding to that comparison signal RS_COMP. The write data WDATA output from the address buffer is supplied to the read unit 110-1.

Figure 10:
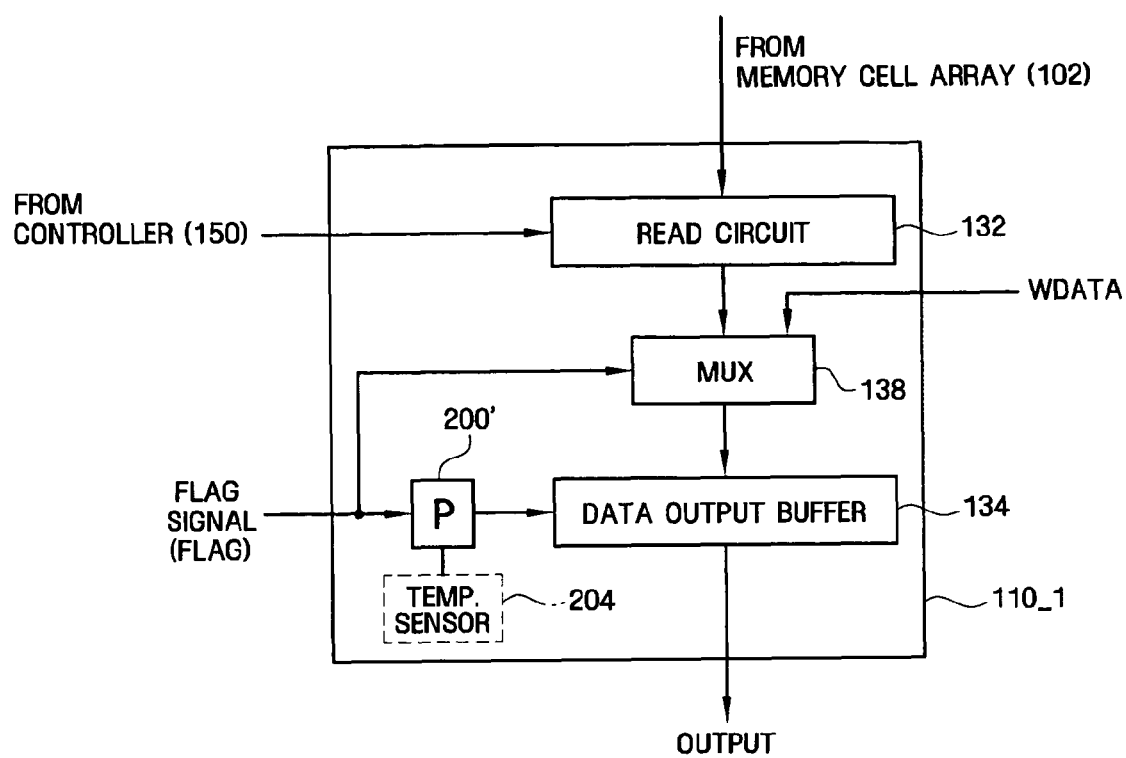
FIG. 10 illustrates the read unit of FIG. 9 according to an embodiment.

FIG. 10 illustrates an embodiment of the read unit 110-1. The embodiment of FIG. 10 is the same as the embodiment of FIG. 4A except that the embodiment of FIG. 10 includes a multiplexer 138 and the pause unit 200 has been replaced with a pause unit 200'. The multiplexer 138 receives the output from the read circuit 132 and write data (if sent) from the write buffer 136. The multiplexer 138 selectively outputs one of the output from the read circuit 132 and write data from the write buffer 136 to the data output buffer 134 based on the flag signal FLAG. In particular, if the flag signal FLAG indicates a match between one of the stored write addresses and a currently received read address (e.g., is logic "1") then the multiplexer 138 outputs the write data WDATA; otherwise, the multiplexer 138 outputs the output from the read circuit 132.

In this embodiment, the pause unit 200' does not disable the data output buffer 134 from outputting data if the flag signal FLAG indicates a match between one of the stored write addresses and a currently received read address (e.g., is logic "1"). Accordingly, the write data WDATA from the write buffer 136 will be output in response to a read operation. By contrast, if the flag signal FLAG indicates no match (e.g., is logic "0"), the pause unit 200' does disable the data output buffer 134 from outputting data for a period time. The period of time may be the same as described above with respect to the pause unit 200.

Figure 11:
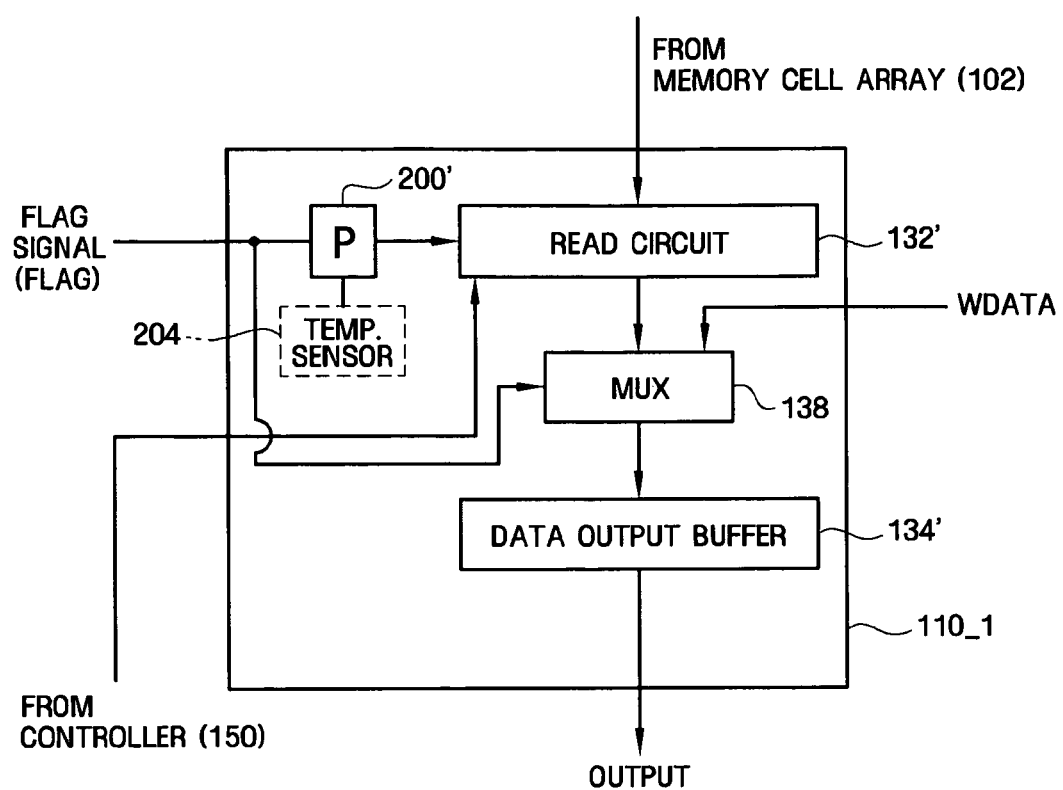
FIG. 11 illustrates the read unit of FIG. 9 according to another embodiment.

FIG. 11 illustrates another embodiment of the read unit 110-1. The embodiment of FIG. 11 is the same as the embodiment of FIG. 4B except that the embodiment of FIG. 11 includes a multiplexer 138 and the pause unit 200 has been replaced with a pause unit 200'. The multiplexer 138 receives the output from the read circuit 132' and write data (if sent) from the write buffer 136'. The multiplexer 138 selectively outputs one of the output from the read circuit 132' and write data from the write buffer 136 to the data output buffer 134' based on the flag signal FLAG. In particular, if the flag signal FLAG indicates a match between one of the stored write addresses and a currently received read address (e.g., is logic "1") then the multiplexer 138 outputs the write data WDATA; otherwise, the multiplexer 138 outputs the output from the read circuit 132'.

In this embodiment, the pause unit 200' does not disable the read circuit 132' from reading data if the flag signal FLAG indicates a match between one of the stored write addresses and a currently received read address (e.g., is logic "1"). However, the write data WDATA from the write buffer 136 will be output in response to a read operation. By contrast, if the flag signal FLAG indicates no match (e.g., is logic "0"), the pause unit 200' does disable the read circuit 132' from reading data for a period time. The period of time may be the same as described above with respect to the pause unit 200.

Figure 12:
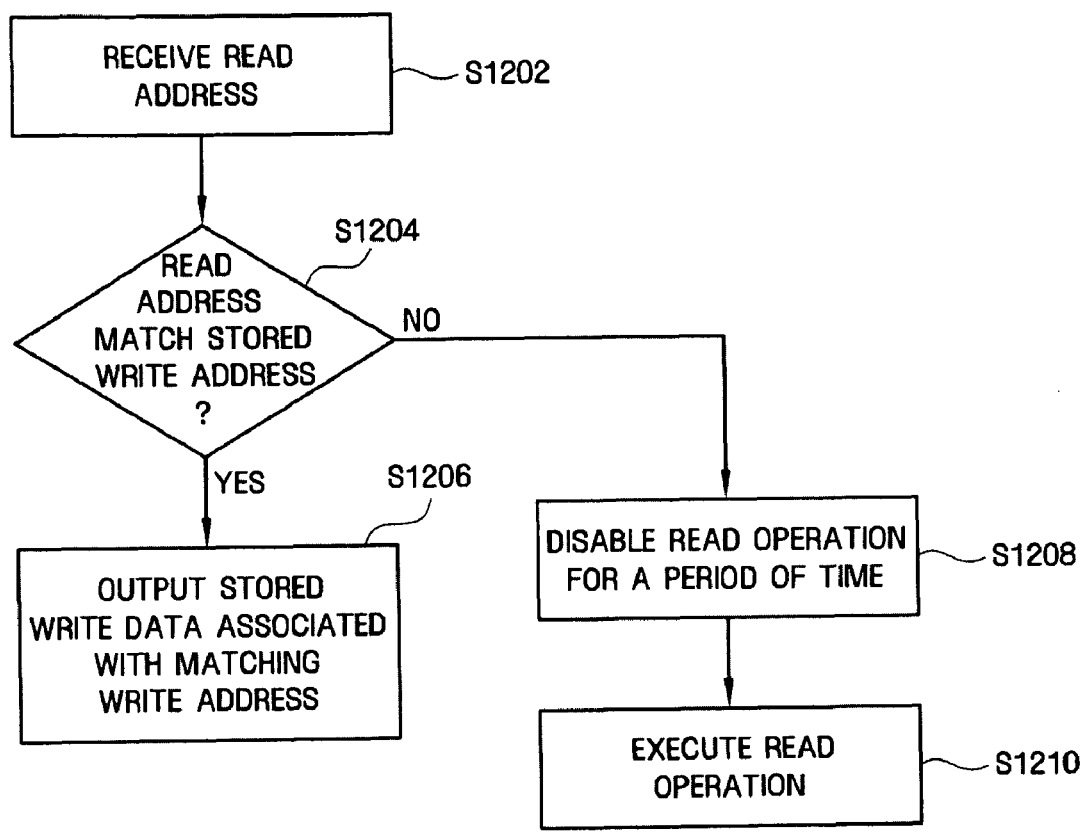
FIG. 12 illustrates a flow chart of an operational concept according to another embodiment.

FIG. 12 illustrates operation of the semiconductor device of FIG. 9 according to one embodiment. As shown, in step S1202 a read address is received as part of a read operation. In step S1204, the write address buffer 124 determines if the read address matches one of the stored write addresses. If so, then in step S1206 the read unit 110-1 outputs write data WDATA stored in the write buffer 136 that is associated with the matching write address. Namely, the flag signal FLAG generated by the write address buffer 124 does not disable the read operation, but causes the multiplexer 138 to output the write data WDATA from the write buffer 136. In step S1204, if the read address does not match a stored write address, then in step S1208, the read unit 110-1 is disabled for a period time. After the period of time, the read unit 110-1 completes execution of the read operation in step S1210. Here, the flag signal FLAG causes the multiplexer 138 to output data from the read circuit 132 or 132'; however, the flag signal FLAG also disables the read operation for a period of time by disabling either the data output buffer 134 (FIG. 10) or the read circuit 132' (FIG. 11).

Fourth Embodiment

Figure 13:
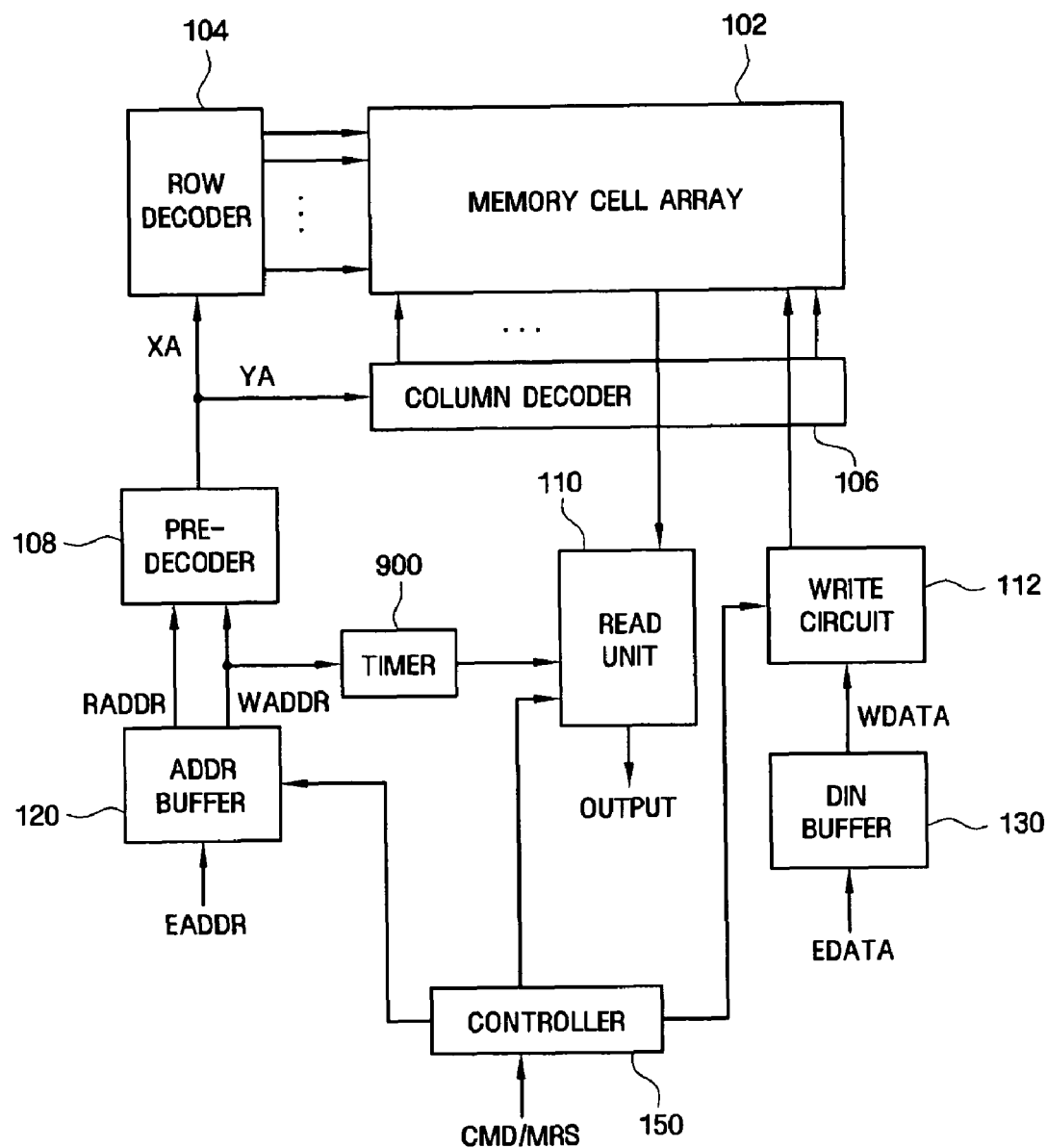
FIG. 13 illustrates a semiconductor device according to a further embodiment.

FIG. 13 illustrates a semiconductor device according to another embodiment. As shown, the embodiment of FIG. 13 is the same as the embodiment of FIG. 1 except that the embodiment of FIG. 13 includes a timer 900. Accordingly, only the differences between the embodiment of FIG. 13 and the embodiment of FIG. 1 will be described for the sake of brevity.

As shown, the timer 900 receives each write address WADDR output from the address buffer 120. Receipt of the write address WADDR from the address buffer 120 triggers the timer 900 to generate a flag signal FLAG of logic "1" for a period time; otherwise, the timer 900 generates a flag signal FLAG of logic "0." This period of time may be fixed or adjustable in the same manner as the period of time associated with the pause unit 200. In one embodiment, the period of time associated with the pause unit 200 and the period of time associated with the timer 900 are set such that the combined time is set equal to or longer than a period of time for data written into the memory cell array 102 to settle or stabilize. For example, the combined time period may be set longer than the expected settling time by a desired margin to account for manufacturing variations. Alternatively, the time period of the pause unit 200 may be set to zero, and the time period of the timer 900 set equal to or longer than a period of time for data written into the memory cell array 102 to settle or stabilize. As a still further alternatively, the pause unit 200 may be eliminated from the read unit 110, and the output of the timer 900 may directly disable/enable the read circuit 132' or the data output buffer 134.

Figure 14:
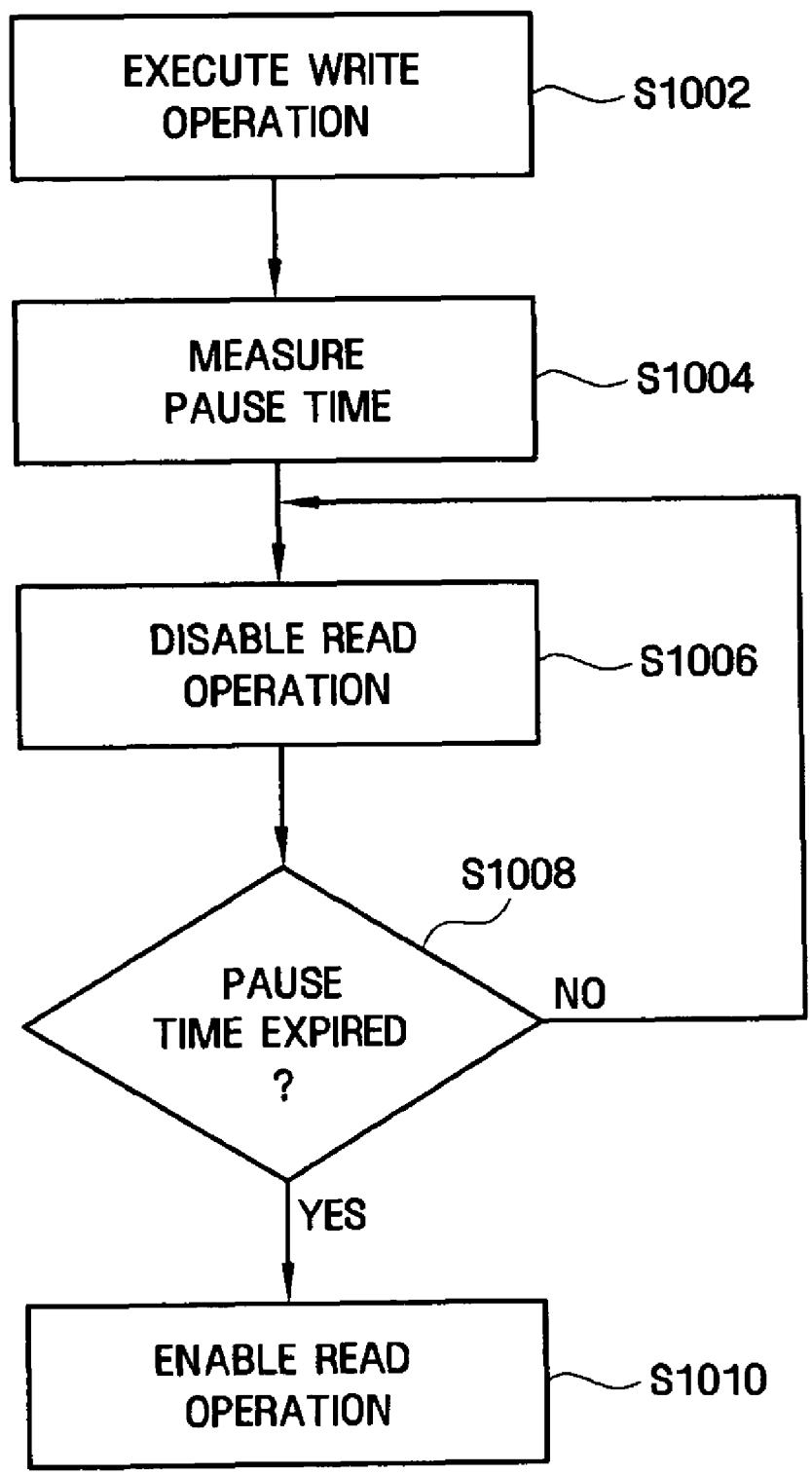
FIG. 14 illustrates a flow chart of an operational concept according to further embodiment.

As will be appreciated, in this embodiment, read operation is disabled for a period of time after each write operation. FIG. 14 illustrates operation of the semiconductor device of FIG. 13 according to one embodiment. As shown, a write operation is executed in step S1002. Then, in step S1004 the timer 900 begins measuring its time period. The read unit 110 and read operation is disabled in step S1006 because the timer 900 generates a logic "1" flag signal FLAG. Next, in step S1008, the read unit 110 determines if the time measured by the timer 900 has expired. Namely, the read unit 110 determines if the timer 900 still outputs a logic "1" flag signal FLAG. If so, then read operation remains disabled; otherwise, in step S1010 read operation is enabled.

Fifth Embodiment

Figure 15:
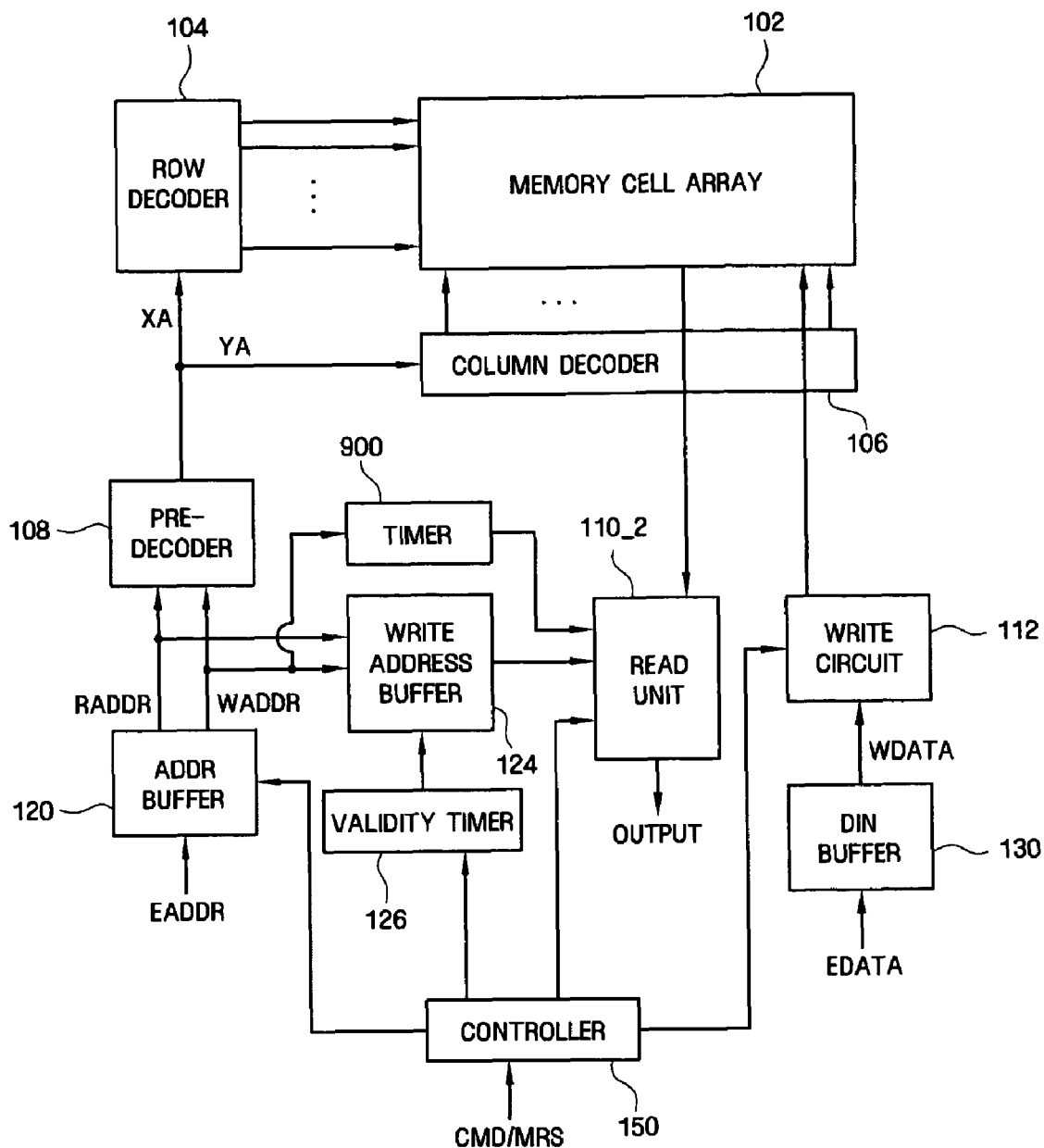
FIG. 15 illustrates a semiconductor device according to another embodiment.

FIG. 15 illustrates a semiconductor device according to another embodiment. As shown, the embodiment of FIG. 15 is the same as the embodiment of FIG. 6 except that the embodiment of FIG. 15 includes the timer 900 and the read unit 110 has been replaced with a read unit 110-2. Accordingly, only the differences between the embodiment of FIG. 15 and the embodiment of FIG. 1 will be described for the sake of brevity.

Figure 16:
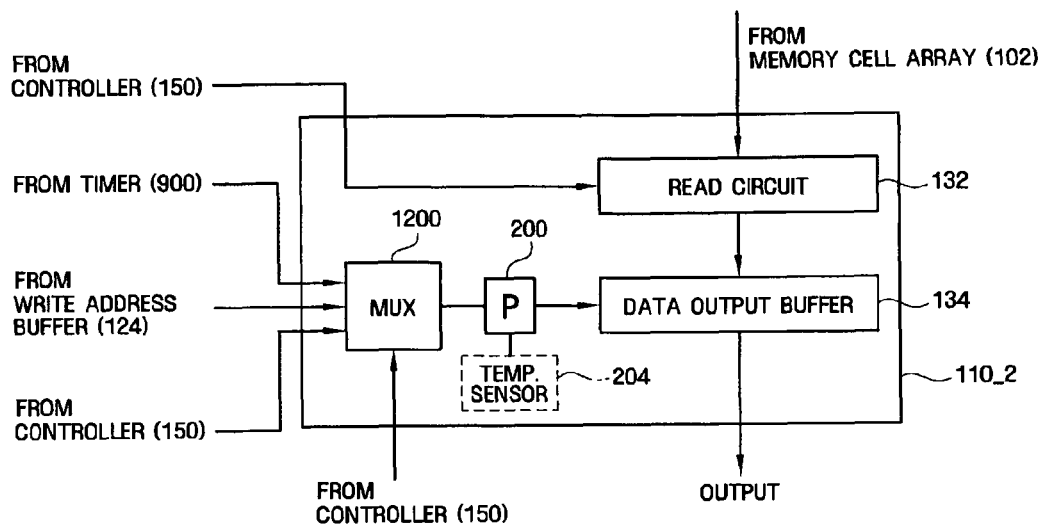
FIG. 16 illustrates an embodiment of the read unit in FIG. 15.

The timer 900 operates in the same manner as described above with respect to FIG. 13. FIG. 16 illustrates one embodiment of the read unit 110-2. The embodiment of FIG. 16 is the same as the embodiment of FIG. 4A except that the read unit 110-2 further includes a multiplexer 1200, which supplies the flag signal FLAG to the pause unit 200. The multiplexer 1200 receives the flag signals FLAG from the write address buffer 124 and the timer 900. Still further the multiplexer 1200 may, optionally, receive the flag signal FLAG from the controller 150 as described with respect to the embodiment of FIG. 1. The multiplexer 1200 outputs one of the received flag signals FLAG to the pause unit 200 as instructed by the controller 150.

In particular, the controller 150 receives a command, mode register set, etc. indicating a desired pause mode. The pause mode may be a first, second or third mode with the first mode being the operating mode of FIG. 1, the second mode being the operating mode of FIG. 6 and the third mode being the operation mode of FIG. 13. If the first mode is selected, then the controller 150 instructs the multiplexer 1200 to output the flag signal FLAG supplied by the controller 150. If the second mode is selected, then the controller 150 instructs the multiplexer 1200 to output the flag signal from the write address buffer 124. If the third mode is selected, then the controller 150 instructs the multiplexer 1200 to output the flag signal from the timer 900.

Figure 17:
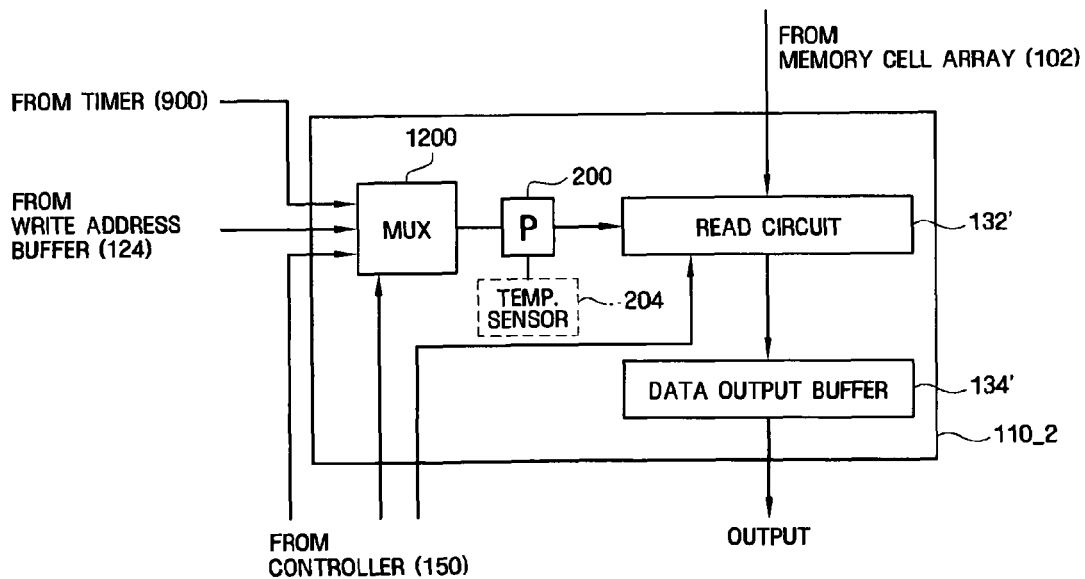
FIG. 17 illustrates another embodiment of the read unit in FIG. 15.

FIG. 17 illustrates another embodiment of the read unit 110-2. The embodiment of FIG. 17 is the same as the embodiment of FIG. 4B except that the read unit 110-2 further includes the multiplexer 1200, which supplies the flag signal FLAG to the pause unit 200. The multiplexer 1200 receives the flag signals FLAG from the write address buffer 124 and the timer 900. Still further the multiplexer 1200 may, optionally, receive the flag signal FLAG from the controller 150 as described with respect to the embodiment of FIG. 1. The multiplexer 1200 outputs one of the received flag signals FLAG to the pause unit 200 as instructed by the controller 150.

As with the embodiment of FIG. 16, in the embodiment of FIG. 17, the controller 150 receives a command, mode register set, etc. indicating a desired pause mode. The pause mode may be a first, second or third mode with the first mode being the operating mode of FIG. 1, the second mode being the operating mode of FIG. 6 and the third mode being the operation mode of FIG. 13. If the first mode is selected, then the controller 150 instructs the multiplexer 1200 to output the flag signal FLAG supplied by the controller 150. If the second mode is selected, then the controller 150 instructs the multiplexer 1200 to output the flag signal from the write address buffer 124. If the third mode is selected, then the controller 150 instructs the multiplexer 1200 to output the flag signal from the timer 900.

Figure 18:
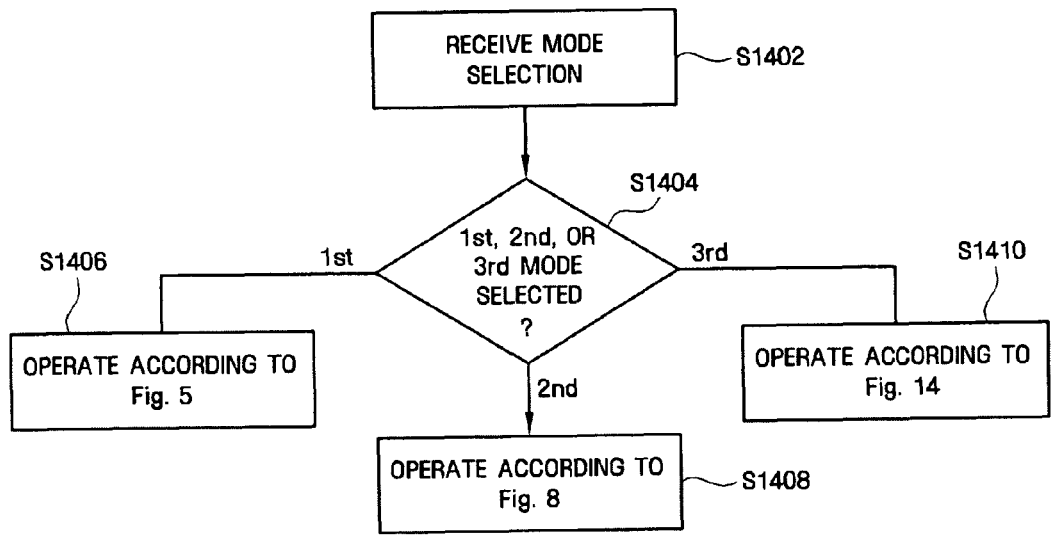
FIG. 18 illustrates a flow chart of an operational concept according to still further embodiment.

FIG. 18 illustrates operation of the semiconductor device of FIG. 15 according to one embodiment. As shown, in step S1402 a mode selection is received as discussed above with respect to FIGS. 15-17. The controller 150 determines the selected mode, and controls the multiplexer 1200 accordingly in step S1404. Namely, if the controller 150 determines the first mode has been selected in step S1404, then in step S1406 the controller 150 controls the multiplexer 1200 to output the flag signal FLAG supplied by the controller 150. As result, the read unit 110-2 will operate as set forth with respect to the flow chart of FIG. 5. If the controller 150 determines the second mode has been selected in step S1404, then in step S1408 the controller 150 controls the multiplexer 1200 to output the flag signal FLAG supplied by the write address buffer 124. As result, the read unit 110-2 will operate as set forth with respect to the flow chart of FIG. 8. If the controller 150 determines the third mode has been selected in step S1404, then in step S1410 the controller 150 controls the multiplexer 1200 to output the flag signal FLAG supplied by the timer 900. As result, the read unit 110-2 will operate as set forth with respect to the flow chart of FIG. 14.

While the above described embodiment includes three modes of operation, it will be appreciated that the embodiment may include additional modes of operation. For example, a mode associated with the embodiment of FIG. 9 may be added. Still further, the embodiment may include less than three modes of operation. For example, the embodiment may include two modes corresponding to any two of the above described embodiments.

Figure 19:
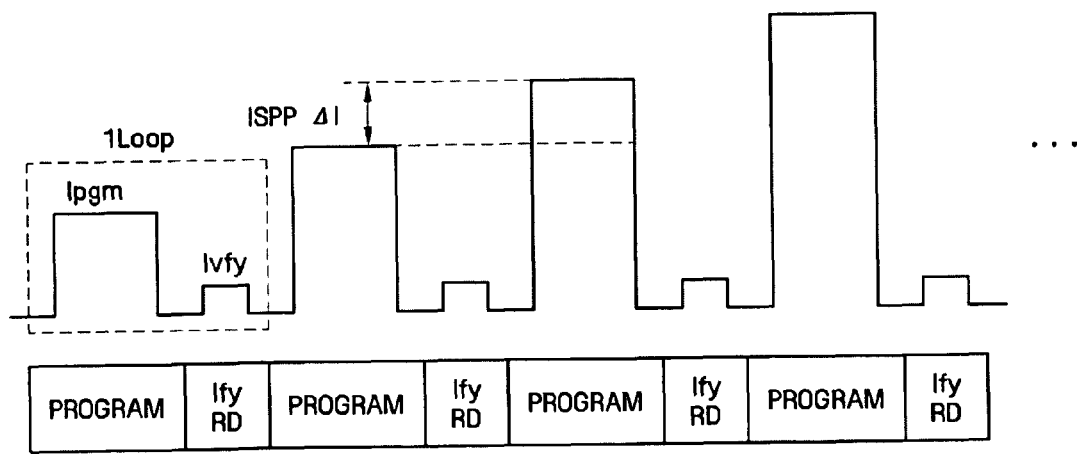
FIG. 19 illustrates a program loop including a plurality of unit program loops using an ISPP method.

It will further be appreciated that the write operation in any of the above embodiments may be a incremental program pulse (ISPP) method as shown in FIG. 19. In particular, FIG. 19 illustrates a program loop including a plurality of unit program loops using an ISPP method. As illustrated in FIG. 19, one unit program loop may include a program operation and a verify read operation. In the program operation, a program current or current waveform Ipgm may be applied to a memory cell. While shown as a simple square wave, it will be appreciated that the program current waveform may be of a shape to either set or reset the phase change material in the memory cell Cp. In the verify read operation, a verify current Ivfy may be applied to the selected memory cell. In ISPP fashion, the program current Ipgm may be increased by a delta current for each unit program loop. Once the verify read operation verifies that data has been properly written, the program loops ends, and the write operation ends. Namely, until verified the write operation is not complete.

It will be understood that FIG. 19 is but one example method of ISPP and that any ISPP method may be used to in the write operation. For example, instead or in addition to adjusting the current magnitude, the duration the current is applied may be changed. Still further, instead of or in additional to the current magnitude and/or the current duration, the waveform shape may be changed.

Still further, it will be appreciated that the memory cells Cp may serve as multi-level cells (MLC). Here instead of just the set and reset states, the memory cell Cp may be programmed to states between the set and reset state such that the memory cell Cp stores more than 1 bit of data. For example, if four states exist, each state may represent two bits of data.

Furthermore, the present invention is not limited to any particular cell array structure, or use of a particular cell array structure with a particular resistance material based memory. Instead, any cell structure such as 3D, crosspoint, wafer stack, etc. may be implemented in the embodiments of the present invention. U.S. Pat. No. 6,351,406 discloses such an example cell structure, and is incorporated by reference herein in its entirety.

Application Embodiments

Figure 20:
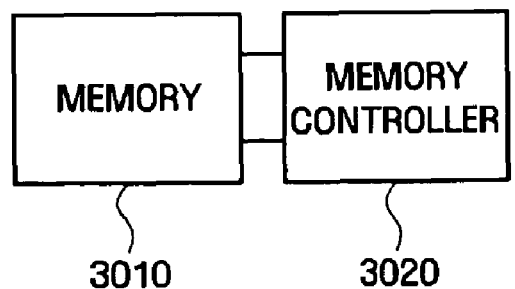

FIG. 20 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals.

Figure 21:
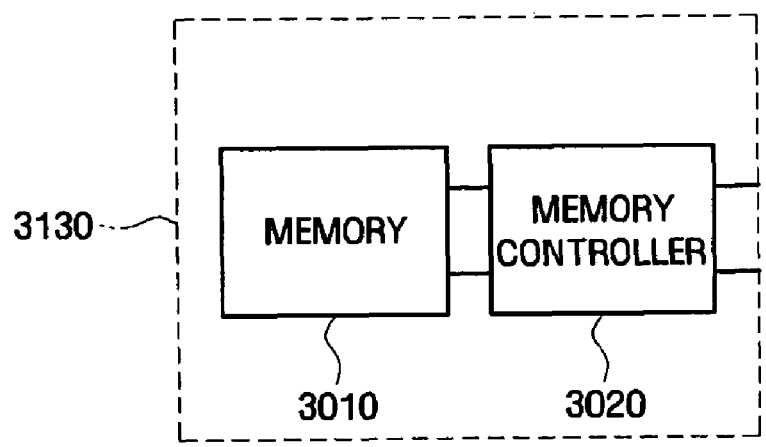

FIG. 21 illustrates yet another embodiment. This embodiment is the same as the embodiment of FIG. 20, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 22:
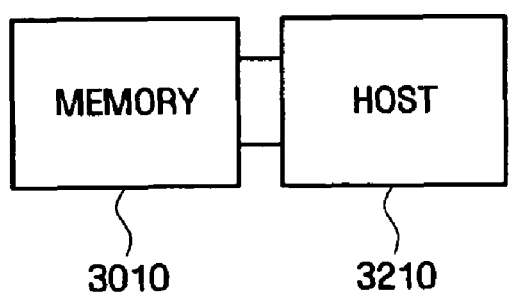

FIG. 22 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 23:
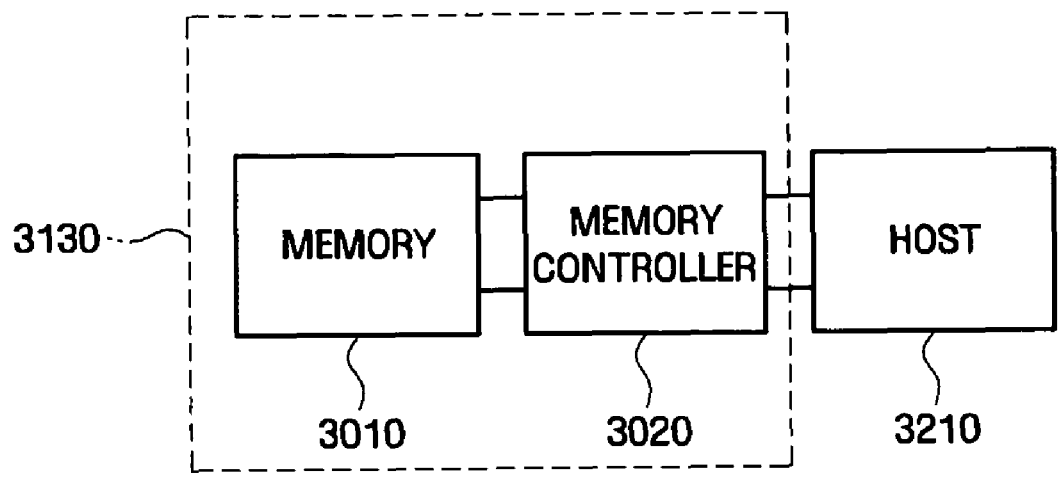

FIG. 23 illustrates an embodiment of the present invention in which the host system 3210 is connected to the card 3130 of FIG. 21. In this embodiment, the host system 3210 applies control signals to the card 3130 such that the memory controller 3020 controls operation of the memory 3010.

Figure 24:
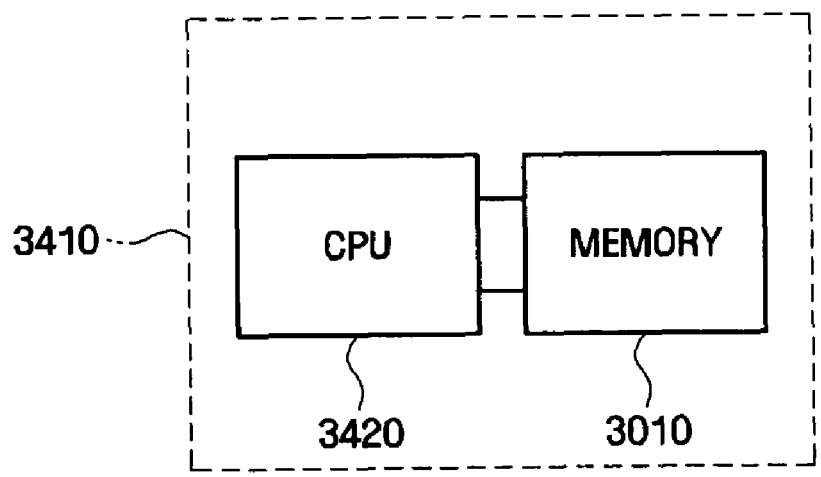

FIG. 24 illustrates a further embodiment of the present invention. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 24 does not illustrate the full complement of components that may be included within a computer system 3410 for the sake of clarity.

FIG. 25 illustrates another embodiment of the present invention. FIG. 25 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 25, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 25. Furthermore, the present invention is not limited to this architecture. For example, the memory 3010 may be replaced with the embodiment of FIG. 20, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

The invention being thus described, it will be obvious that the same may be varied in many ways. Such variations are not to be regarded as a departure from the invention, and all such modifications are intended to be included within the scope of the invention.

We claim:

1. A semiconductor device, comprising:
    a non-volatile memory cell array;
    an address buffer configured to store an address associated with data being written into the non-volatile memory cell array;
    a recovery timer configured to measure a first time period since a last write operation; and
    a read unit configured to selectively disable read operation for the non-volatile memory cell array based on whether the first time period has expired.

2. The semiconductor device of claim 1, wherein a length of the first time period is equal to or greater than an amount of time for data written in the non-volatile memory cell array to stabilize.

3. The semiconductor device of claim 2, wherein the read unit is configured to disable the read operation if the first time period has not expired.

4. The semiconductor device of claim 3, wherein the read unit is configured to not disable the read operation if the first time period has expired.

5. The semiconductor device of claim 3, wherein the read unit is configured to disable reading of data from the non-volatile memory cell array if the first time period has not expired.

6. The semiconductor device of claim 3, wherein the read unit is configured to disable outputting read data from the non-volatile memory cell array if the first time period has not expired.

7. The semiconductor device of claim 3, wherein the first time period is fixed.

8. The semiconductor device of claim 3, wherein the first time period varies based on operating conditions.

9. The semiconductor device of claim 8, wherein the read unit is configured to disable read operation for a second period of time based on whether the first time period has expired.

10. The semiconductor device of claim 3, further comprising:
    a write circuit configured to write data into one block of cells in the non-volatile memory cell array while read operation is disabled for another block of cells in the non-volatile memory cell array.

11. A method of operating a semiconductor device, comprising:
    storing an address associated with data being written into a non-volatile memory cell array;
    measuring a first time period since a last write operation; and
    selectively disabling read operation for the non-volatile memory cell array based on whether the first time period has expired.

* * * * *